(12) United States Patent
Kuo

(10) Patent No.: US 6,315,432 B1
(45) Date of Patent: Nov. 13, 2001

(54) LIGHT-EMITTING DIODE (LED) DEVICE

(75) Inventor: Peter Kuo, Chung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/459,955

(22) Filed: Dec. 13, 1999

(51) Int. Cl.[7] .................................................. F21V 21/30
(52) U.S. Cl. .......................... 362/287; 362/276; 362/802; 362/427; 362/800
(58) Field of Search .............................. 362/287, 35, 276, 362/802, 421, 427, 800; 250/493.1, 504 R, 342; 340/567

(56) References Cited

U.S. PATENT DOCUMENTS

| | | | |
|---|---|---|---|
| 5,700,084 | * 12/1997 | Yasukawa et al. | 362/375 |
| 6,019,477 | * 2/2000 | Wegrzyn et al. | 362/427 |
| 6,170,967 | * 1/2001 | Usher et al. | 362/427 |

* cited by examiner

Primary Examiner—Thomas M. Sember
(74) Attorney, Agent, or Firm—Wei Te Chung

(57) ABSTRACT

A rotatable light-emitting diode (LED) arrangement includes a LED member, a retaining housing for retaining the LED therein and a positioning base for positioning the rotatable housing to a panel of an electronic/electrical device, such as a back panel of a computer enclosure. The retaining housing includes a ball-like retaining portion defining a chamber for retaining the LED therein, and a cylindrical portion connecting with the ball-like retaining portion for receiving leads of the LED therein. The positioning base defines an unclosed spherical opening therein for rotatably receiving the ball-like retaining portion of the retaining housing and a pair of curved annular recesses respectively connecting with opposite open ends of the cylindrical opening for allowing proper rotations of the ball-like retaining portion of the retaining housing therein. Thus, the LED member of the LED arrangement can emit infrared lights in different directions simply by properly rotating the ball-like retaining portion of the retaining housing, whereby a detector can easily detect the infrared emitted by the LED without being previously positioned.

15 Claims, 6 Drawing Sheets

LIGHT-EMITTING DIODE (LED) DEVICE

BACKGROUND OF THE INVENTION

The present invention relates to a light-emitting diode (LED) arrangement, and particularly to a rotatable LED arrangement which can be conveniently adjusted to emit infrared in different directions.

As shown in FIG. 6, a LED device 50 is traditionally fixed in a front face 51 of an electronic/electrical element 5. A detecting element 6 can safely detect the infrared emitted by the LED device 50 only when the detecting element 6 is previously located only within the reversed conical infrared covering zone 502 of the LED device 50.

Pertinent conventional LED devices are disclosed in U.S. Pat. Nos. 4,978,317; 5,700,157; 5,685,737 and 5,704,802. Particularly, U.S. Pat. No. 5,613,873 discloses a LED fixed within a cavity defined in the front face of a housing of a modular jack connector in a preferred embodiment thereof. Alternately, in another preferred embodiment of U.S. Pat. No. 5,613,873, the LED is fixed within a cavity defined in the bottom face of the housing and meanwhile the housing is made of transparent or translucent resin for rendering the infrared rays emitted by the LED transmitting penetrating therethrough.

However, a common deficiency of such LED devices is that the LED is fixedly secured in an electronic/electrical element, and thus can only emit infrared rays in a particular direction. The light emitted by the LED is visible to an observer. However, if it is a detector that is supposed to detect the light emitted by the LED, the detector can safely detect the LED only when it is previously positioned within the reversed conical infrared covering scope of the LED in the particular direction.

Hence, an improved LED device is required for rendering a detector to detect the infrared emitted by the LED device without strict position requirements.

BRIEF SUMMARY OF THE INVENTION

A main object of the present invention is to provide a rotatable light-emitting diode (LED) arrangement which can emit infrared in different directions by proper rotations thereof.

Another object of the present invention is to provide a rotatable LED arrangement positioned in a panel of an electronic/electrical device providing a wide infrared covering zone by properly rotating the LED thereof thereby facilitating a detector to detect the infrared emitted by the LED thereof.

A rotatable light-emitting diode (LED) arrangement in accordance with the present invention comprises a LED member, a retaining housing for retaining the LED therein and a positioning base for positioning the rotatable housing to a panel of an electronic/electrical device, such as a back panel of a computer enclosure. The retaining housing includes a ball-like retaining portion defining a chamber for retaining the LED member therein, and a cylindrical portion connecting with the ball-like retaining portion for receiving leads of the LED therein. The positioning base defines an unclosed spherical opening therein for rotatably receiving the ball-like retaining portion of the retaining housing and a pair of curved annular recesses respectively connecting with opposite open ends of the cylindrical opening for allowing proper rotations of the ball-like retaining portion of the retaining housing therein. Thus, the LED member of the LED arrangement can emit infrared lights in different directions simply by properly rotating the ball-like retaining portion of the retaining housing, whereby a detector can easily detect the infrared emitted by the LED without being previously positioned.

Other objects, advantages and novel features of the invention will become more apparent from the following detailed description when taken in conjunction with the accompanying drawings.

DETAILED DESCRIPTION OF THE INVENTION

Figure 1:
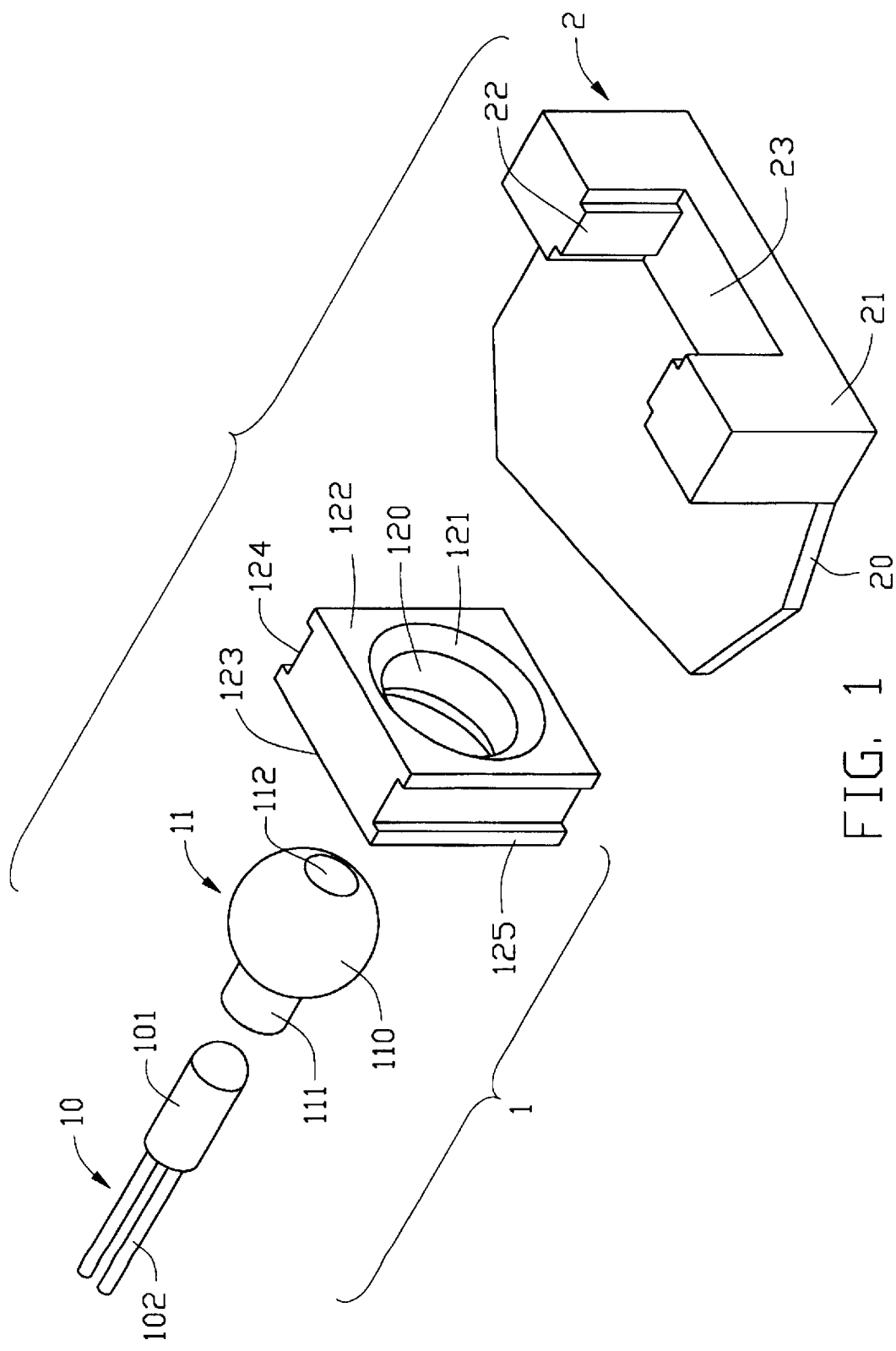
FIG. 1 is an exploded view of a rotatable LED arrangement and a positioning portion of a panel of an electronic/electrical device in accordance with the present invention.
Figure 2:
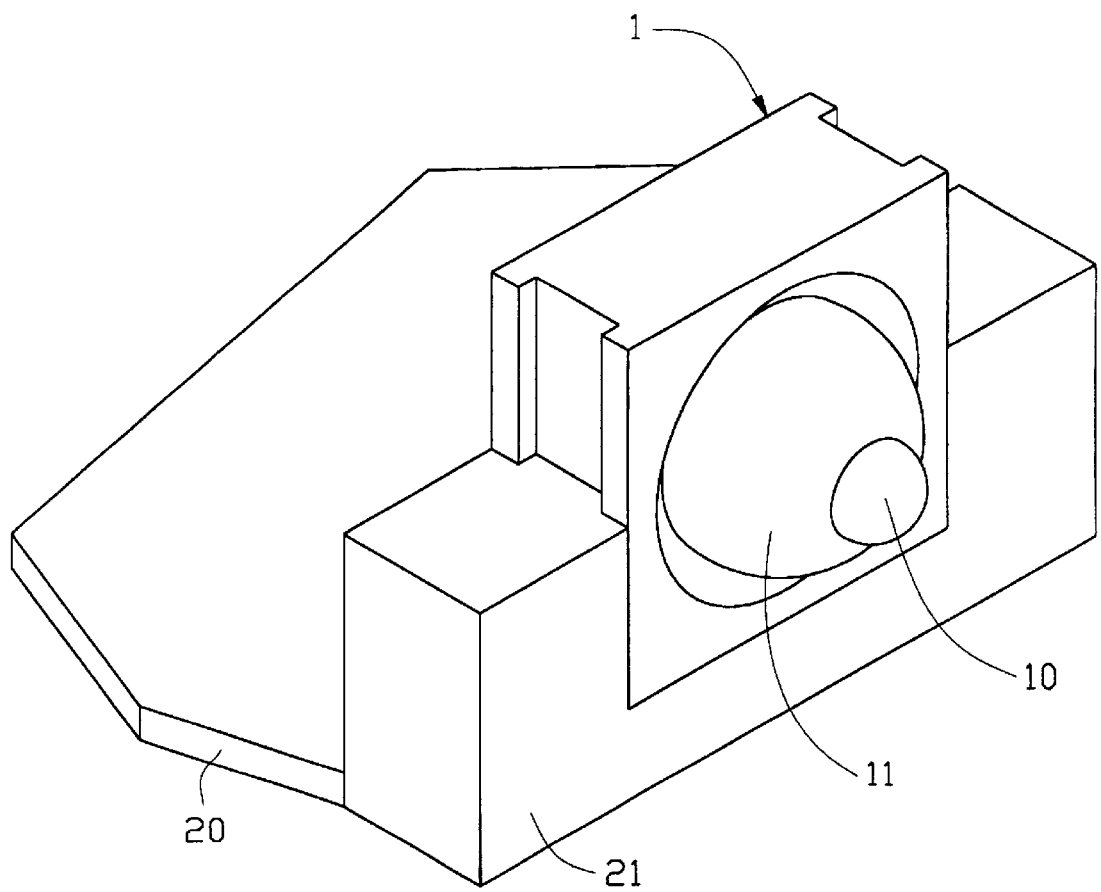
FIG. 2 is an assembled view of FIG. 1.
Figure 3:
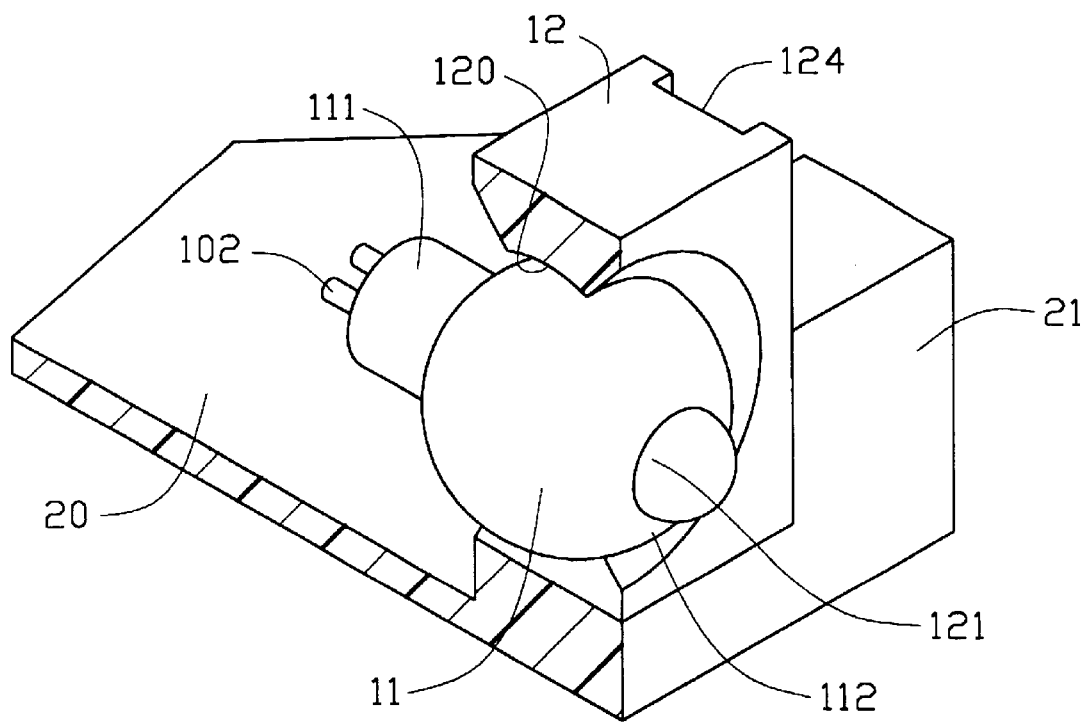
FIG. 3 is a partially cross-sectioned view of FIG. 2.

Referring to FIGS. 1–3, a light-emitting diode (LED) arrangement 1 in accordance with the present invention comprises a LED member 10, a retaining housing 11 for retaining the LED member 10 therein, a positioning base 12 for positioning the LED arrangement 1 to a positioning portion 21 of a panel 20 of an electronic/electrical device 2.

The LED member 10 has a LED main body 101 and a pair of leads 102 extending rearward from the LED main body 101 for directly or indirectly electrically connecting to a circuit board (not shown). The retaining housing 11 is made of any suitable elastic material, and in this embodiment, is preferably made of rubber for facilitating assembly with the positioning base 12. The retaining housing 11 includes a ball-like retaining portion 110 and a cylindrical portion 111 connecting with the ball-like retaining portion 110. The retaining housing defines a chamber 112 extending through the ball-like retaining portion 1 10 and the cylindrical portion 111 for retaining the LED member 10 therein.

The positioning base 12 can be designed to be any configuration corresponding to that of the positioning portion 21 of the panel 20 of the electronic/electrical device 2. In this preferred embodiment, the positioning base 12 is particularly rectangular and defines a spherical opening 120 between a front face 122 and a rear face 123 thereof. Since the width between the front face 122 and the rear face 123 is limited, the spherical opening 120 substantially does not form a complete spherical space therein. A pair of curved annular recesses 121 is defined to respectively connecting with opposite ends of the opening 120. A pair of positioning grooves 124 is defined in opposite lateral sides 125 of the retaining base 12.

The positioning portion 21 of the panel 20 defines a positioning cutout 23 for positioning the LED arrangement I therein. A pair of positioning projections 22 inwardly extends into the positioning cutout 23 for engaging with the corresponding positioning grooves 124 of the retaining housing 12.

In assembly, the LED member 10 is first assembled into and retained within the chamber 112 of the retaining housing 11. The LED main body 101 of the member 10 partially extends forward beyond the retaining housing 11, and the leads 102 outwardly extend beyond the cylindrical portion 11 1 of the retaining housing 11. The assembled LED member 10 and the retaining housing 11 are then assembled into the opening 120 of the positioning base 12. The ball-like retaining portion 110 of the retaining housing 11 engages within the non-closed spherical opening 120 of the positioning base 12. Thus, the rotatable LED arrangement 1 is completely assembled.

The completed rotatable LED arrangement 1 is fixed to the positioning portion 21 of the panel 20 of the electronic/electrical device 2. The positioning projections 22 of the positioning portion 21 engage with the corresponding positioning grooves 124 of the positioning base 12 thereby securing the rotatable LED arrangement 1 with the panel 20.

Figure 4:
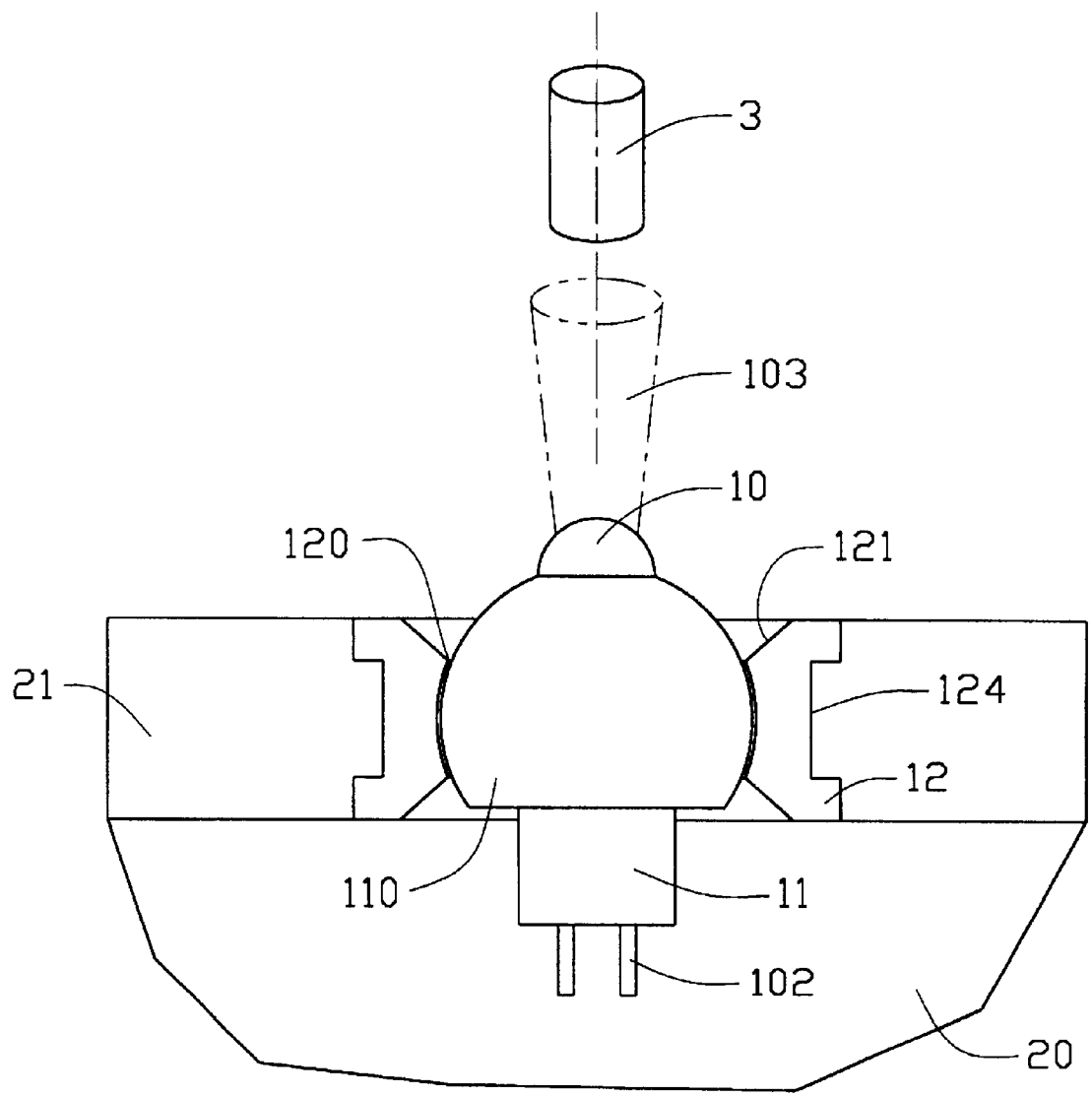
FIG. 4 is a planar and partially cross-sectioned view of the rotatable LED arrangement and a detector.
Figure 5:
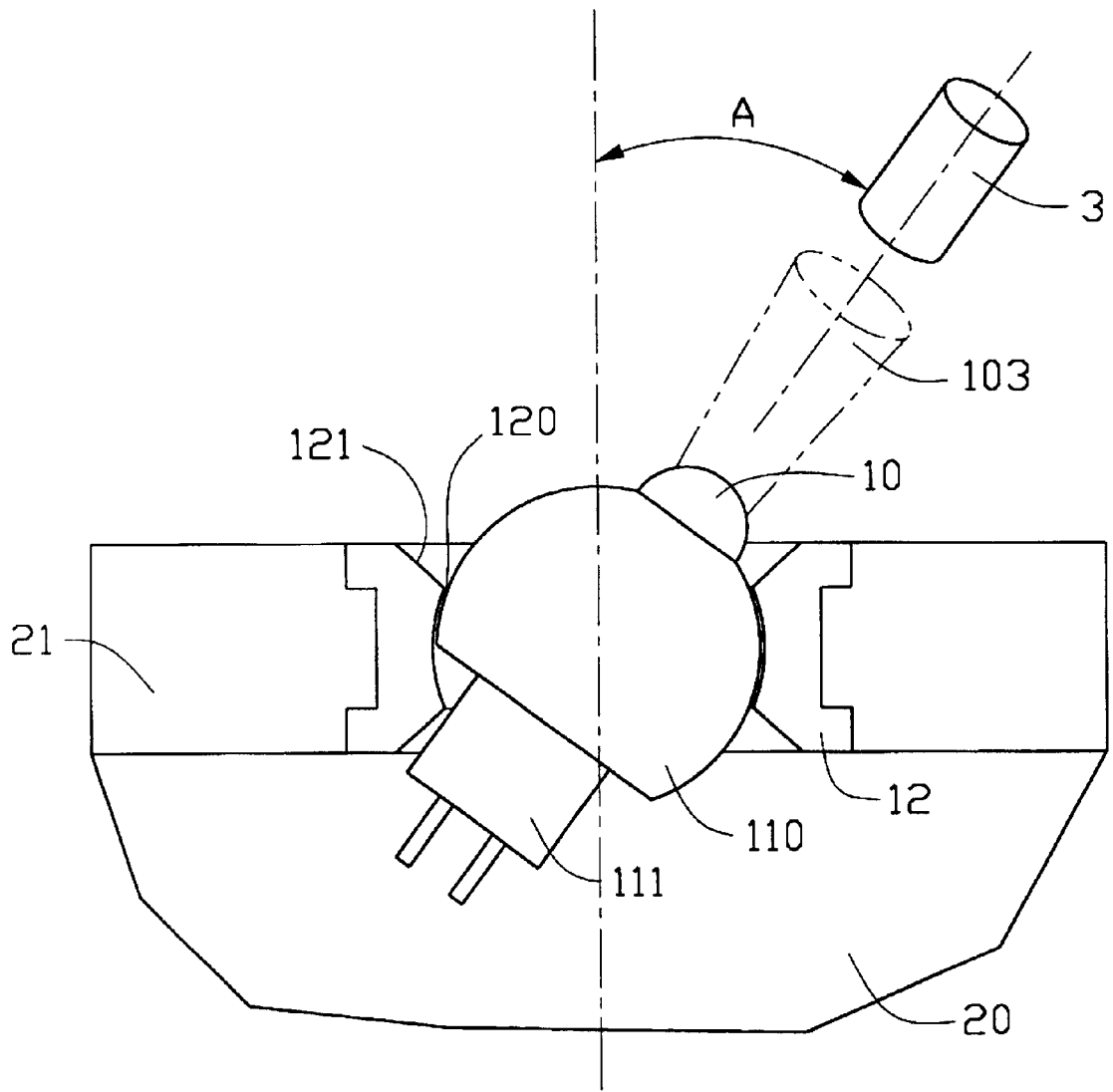
FIG. 5 is another planar and partially cross-sectioned view of the rotatable LED arrangement and the detector of FIG. 4.
Figure 6:
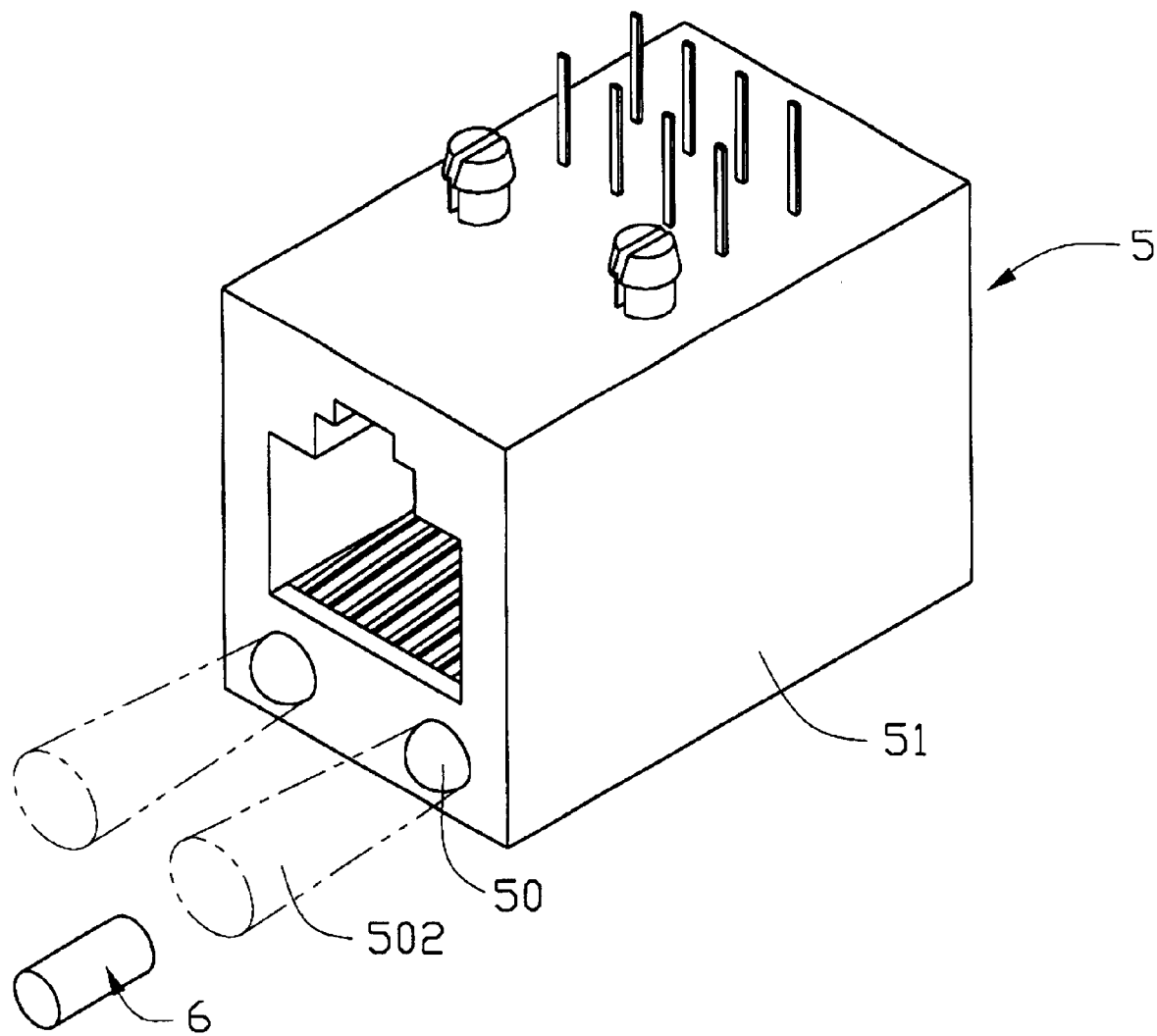
FIG. 6 is a perspective view of a prior LED fixed in a housing of an electronic/electrical device and a detector.

Referring further to FIGS. 4 and 5, since the retaining housing 11 is made of elastic material, such as rubber, the ball-like retaining portion 110 of the retaining housing 11 can be adjusted to properly rotate within the spherical opening 120 of the positioning base 12 due to its elasticity. Therefore, if a detector element 3 is not previously positioned within a conical infrared covering zone 103 of the LED member 10 of the rotatable LED arrangement 1, the detector element 3 need not to be moved to fall within the conical infrared covering zone 103 of the LED member 10. What is needed is to readily adjust the ball-like retaining portion 110 of the rotatable LED arrangement 1 for a suitable angle A to make the conical infrared covering zone 103 cover the detector 3. Furthermore, the conical infrared covering zone 103 of the rotatable LED arrangement 1 can be easily adjusted to follow the tracks of the detector 3 in cases the detector 3 has no fixed positions.

It should be understood that the LED member 10 can be integrally formed with the retaining housing 11 thereby simplifying the manufacturing process of the LED arrangement 1. The retaining housing 11 can be designed to any other suitable configuration so long as the retaining housing 11 can be properly rotated when the LED arrangement 1 engages with the panel 20 of the electronic/electrical device 2, or directly engages with the electronic/electrical device 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A rotatable light-emitting diode (LED) arrangement for emitting infrared to be detected by a detector, the rotatable LED arrangement comprising:
   an LED member having a LED main body capable of emitting infrared light;
   a retaining housing defining a chamber for retaining the LED main body of the LED member therein; and
   a positioning base forming a front face, a rear face and an opening extending between the front face and the rear face for positioning and allowing the retaining housing to rotate therein;
   wherein the retaining housing is rotatably retained to the positioning base and extends forward beyond the front face of the positioning base, thereby enabling the LED member to emit infrared lights forming a conical infrared covering zone which can follow tracks of the detector by properly rotating the LED member.

2. The rotatable LED arrangement as claimed in claim 1, wherein the retaining housing forms a ball-like retaining portion for retaining the LED main body of the LED member therein.

3. The rotatable LED arrangement as claimed in claim 2, wherein the opening of the positioning base is partially spherical for rotatably positioning the ball-like retaining portion of the retaining housing.

4. The rotatable LED arrangement as claimed in claim 1, wherein a pair of curved annular recesses is respectively defined at opposite sides of the spherical opening of the positioning base.

5. The rotatable LED arrangement as claimed in claim 1, wherein the LED member has a pair of leads extending rearward from the LED main body.

6. The rotatable LED arrangement as claimed in claim 5, wherein the retaining housing forms a cylindrical portion extending rearward from a retaining portion thereof, and the chamber extends through the cylindrical portion for allowing the leads of the LED member to extend rearward therethrough.

7. The rotatable LED arrangement as claimed in claim 1, wherein the positioning base is substantially rectangular and defines a pair of positioning grooves on opposite lateral sides thereof, respectively.

8. The rotatable LED arrangement as claimed in claim 1, wherein the retaining housing is made of elastic material.

9. A rotatable light-emitting device arrangement for emitting infrared to be detected by a detector which may not normally point to a fixed positioning base on which an LED member is positioned, comprising:
   the LED defining a main body;
   an elastic retaining housing defining a chamber receiving the main body of the LED therein, and a spherical surface thereon; and
   the fixed positioning base defining an partially spherical opening extending therethrough in a front-to-back direction; wherein
   the elastic retaining housing with the associated LED is assembled to the positioning base in a back-to-front direction and retainably rotatably received within the opening.

10. The arrangement as claimed in claim 9, wherein said LED extends forwardly beyond the retaining housing.

11. The arrangement as claimed in claim 9, wherein a panel defines a cutout, and the positioning base is assembled into said cutout in a vertical direction perpendicular to said back-to-forth direction.

12. A method of creating an infrared covering zone system around a panel, comprising the steps of:
   providing an LED member with a main body capable of emitting infrared light;
   enclosing the main body of said LED member with a retaining housing, said retaining housing defining a circular surface;
   providing a fixed positioning base with regard to the panel, said positioning base defining a partially circular opening in compliance with the circular surface of the retaining housing; and assembling the housing with the associated LED member into the opening wherein said retaining housing is retainably rotatably received within said opening so as to create the conical infrared covering zone in front of the panel by properly rotating the retaining housing within the opening.

13. The method as claimed in claim 12, further including a step of providing one of said retaining housing and the positioning base with elasticity so as to allow said retaining housing to be assembled into the opening in a back-to-front direction.

14. The method as claimed in claim 12, wherein one of said retaining housing and said LED member extends forward beyond the opening and is exposed to an exterior for easy accessibly manually rotatable adjustment.

15. The method as claimed in claim 12, wherein a detector is disposed within said covering zone.

* * * * *